United States Patent
Gilmore et al.

(10) Patent No.: US 6,670,615 B2
(45) Date of Patent: Dec. 30, 2003

(54) ELECTRON DETECTION DEVICE

(75) Inventors: William H Gilmore, Livermore, CA (US); Keith Graham Dicks, Buckinghamshire (GB)

(73) Assignee: Oxford Instruments Analytical Ltd., Oxon (GB)

( * ) Notice: Subject to any disclaimer, the term of this patent is extended or adjusted under 35 U.S.C. 154(b) by 0 days.

(21) Appl. No.: 10/245,545

(22) Filed: Sep. 18, 2002

(65) Prior Publication Data
US 2003/0057377 A1 Mar. 27, 2003

(30) Foreign Application Priority Data
Sep. 25, 2001 (GB) ............................................... 0123053

(51) Int. Cl.[7] ............................................... H01J 37/00
(52) U.S. Cl. ...................... 250/397; 250/310; 250/311; 250/306; 250/307; 250/492.1
(58) Field of Search ................................ 250/397, 310, 250/311, 306, 307, 492.1

(56) References Cited

U.S. PATENT DOCUMENTS

| | | | |
|---|---|---|---|
| 5,093,572 A | * | 3/1992 | Hosono ...................... 250/310 |
| 5,500,528 A | * | 3/1996 | Matsui et al. ................ 250/310 |
| 5,517,033 A | * | 5/1996 | Krivanek et al. ............ 250/397 |
| 5,932,880 A | * | 8/1999 | Koguchi et al. ............. 250/397 |

* cited by examiner

Primary Examiner—John R. Lee
Assistant Examiner—Zia R. Hashmi

(57) ABSTRACT

An electron detection device for use with an electron microscope defining a sample chamber. The device comprises a housing which in use is mounted to and opens into or forms part of a sample chamber of an electron microscope. A support structure is attached to the detection device housing and is in communication with the sample chamber in use. The support structure supports within it a member from which depends a phosphor scintillator, the member being movable between an extended position in which the phosphor scintillator is close enough to a sample to be struck by electrons and a retracted position. A control system controls movement of the member; and a detector monitors light emitted by the phosphor scintillator in response to electron impact.

16 Claims, 1 Drawing Sheet

ELECTRON DETECTION DEVICE

FIELD OF THE INVENTION

The invention relates to an electron detection device for use with an electron microscope such as a scanning electron microscope.

DESCRIPTION OF THE PRIOR ART

The orientation of individual crystals in a crystalline sample is of importance to researchers in determining the mechanical properties of materials. Semiconductors, metals and ceramics are examples of these materials. Electron Backscatter Diffraction (EBSD) is a technique employed using a Scanning Electron Microscope (SEM) that helps researchers determine crystal orientation and thereby realizing phases, phase boundaries and textures. The crystalline sample is tilted to a high angle relative to the horizontal plane, producing an almost grazing angle relative to the SEM electron beam. When the sample is scanned by the electron beam secondary or back scattered electrons and hazardous x-rays are emitted by the sample in a characteristic manner according to the physical laws of electron and x-ray diffraction.

Typically, an EBSD detector is interfaced with the SEM vacuum chamber on an available port, i.e. a hole in the SEM chamber wall. Low pressure is required inside the SEM chamber to allow electron interaction with the sample for various scientific applications, including, but not limited to imaging and x-ray analysis of the sample. The SEM chamber wall is the barrier that separates the vacuum environment inside the chamber and the atmosphere outside the chamber. Detectors, motion and electrical feed-thrus and other apparatus must pass through the chamber ports and also create a vacuum seal at the port. This vacuum seal can be static, i.e. the seal always touches the same area of the penetrating device and the SEM chamber port because the device does not move, or the seal can be dynamic, i.e. the area where the seal touches the device or the port changes as required by the motion of the device. If the relative motion of the device is translation along the axis the seal is referred to as being a "sliding" dynamic seal. If the relative motion of the device is rotation about the axis the seal is referred to as a "rotating" dynamic seal.

An example of a conventional EBSD detector is described in U.S. Pat. No. 5,557,104. In this case, the primary components of a commercially made, modern EBSD detector consists of six components. A phosphor front coated glass substrate is placed close to the sample, with surface parallel to the electron beam and is struck by the back scattered electrons. This phosphor substrate is usually supported in position by the mechanical components of the EBSD detector, typically a metal tube which may contain a fibre optic bundle. The interaction of the electrons with the phosphor produces visible light that is displayed in characteristic patterns and is viewed on the back side of the phosphor substrate. It is these patterns that are recognized and analyzed in determining the crystal orientations in the sample. If the tube does not contain a fibre optic bundle, a glass window, typically interspersed with lead to attenuate hazardous x-rays, is positioned further back from the sample, typically on the other end of the tube. The glass window is mechanically sealed on the far end of the tube, thus acting as part of the SEM vacuum barrier. The phosphor substrate, the metal tube (fibre optic bundle) and the glass window are inserted through the SEM chamber port and are vacuum sealed at the port. The vacuum seal is created by either a rubber O-ring around the outside of the tube or a very expensive and fragile welded metal bellows. Behind the glass window, on the atmosphere side, is positioned a low light level camera. Light from the phosphor is coupled to the camera by either a fibre optic bundle or by a lens system that focuses the light from the phosphor screen onto the camera transducer which is typically a Charge Coupled Device (CCD) which produces an electronic signal processed and output to a computer interface. The computer hardware and specialized software is used to present the pattern images on the monitor and aid in the recognition and analysis of the EBSD patterns.

The phosphor substrate and the metal tube which protrude into the SEM vacuum chamber occupy valuable space which must be shared inside the SEM vacuum chamber. Sample positioning and manipulation devices, such as the SEM stage, other detectors, such as Energy and X-ray Dispersive spectrometers, chamber scopes (sample viewing cameras), electron secondary and back scattered imaging devices all require space to operate inside and outside the SEM chamber. Most of these devices are designed with and include retraction mechanisms that remove the device from an operational position to a position where they will not interfere mechanically with other devices during their operation.

The vacuum seal around the EBSD metal tube is a dynamic seal and has potential to fault the SEM vacuum system when it is being retracted due to it's relatively large size (typically 30 to 40 millimeters in diameter). If the vacuum system of the SEM is faulted during operation costly electron gun filaments can be destroyed and require replacement. This kind of seal is a "sliding" O-ring seal, because the tube translates along it's axis, sliding through the O-ring. As the tube slides through the O-ring it carries with it small dust and debris particles which cling to the rubber O-ring between the O-ring and the sealing area on the tube. The mechanical force required to slide the tube through the O-ring is the sum of the friction force and the force from atmospheric pressure. As the tube diameter increases the contact area of the seal increases as does the required retraction force and the potential to cause a vacuum leak.

The EBSD metal tube interior has potential to cause optical interference detected as background noise of various levels by the camera. Some of the light that is emitted from the phosphor and is transmitted through the glass substrate bounces off the interior wall of the metal tube interfering with those rays of light that strike the CCD directly. Also, the lead glass window that prevents x-rays from escaping reduces the light signal detected by the camera.

SUMMARY OF THE INVENTION

In accordance with a first aspect of the present invention, an electron detection device for use with an electron microscope defining a sample chamber comprises a housing which in use is mounted to and opens into or forms part of a sample chamber of an electron microscope, a support structure attached to the detection device housing and in communication with the sample chamber in use, the support structure supporting within it a member from which depends a phosphor scintillator, the member being movable between an extended position in which the phosphor scintillator is close enough to a sample to be struck by electrons and a retracted position; a control system for controlling movement of the member; and a detector for monitoring light emitted by the phosphor scintillator in response to electron impact.

In contrast to the prior art, we avoid having to move a large metal housing in and out of the vacuum and instead only have to move the phosphor scintillator support member.

The control system can take a variety of forms but in one preferred approach includes a rotatably mounted shaft extending through a bore of the support structure to which it is sealed by a dynamic annular seal. Such a shaft can have a small diameter and thus only requires a small seal leading to considerably increased reliability over the sliding seals and bellows of the prior art and at substantially reduced cost.

Typically, the annular seal is in the form of an O-ring.

The advantage of this retraction mechanism is that in the preferred example less than ½ of a revolution (maximum for the chosen motor) of the motor shaft generates over 110 mm stroke of the telescoping tube (see below) which significantly improves the integrity, reliability and life of the dynamic vacuum seal. Multiple motor shaft revolutions will wear the O-ring and shorten the life of the seal.

Other examples of control systems include stepping motor (s) and controller, lead screw and motor, and cables, pulleys, springs and motor.

It is important to move the phosphor scintillator to the retracted position so that it does not interfere with other apparatus that may be used with the electron microscope. The fragile phosphor scintillator is also therefore protected from damage by other devices in motion within the sample chamber.

Preferably, the phosphor scintillator is pivoted to the member so that it can be rotated into a rest position when not in use. The advantage of this is that the sample can be viewed through the support structure, possibly with the aid of external light sources, enabling the sample to be viewed directly by the detector without interference by the phosphor scintillator. This is useful for positioning the sample.

Conveniently, the phosphor scintillator is coupled to the member such that the movement of the member causes pivoting movement of the phosphor scintillator. However, it would also be possible to incorporate an additional actuator mechanism for pivoting the phosphor scintillator.

In a particularly preferred arrangement, the support structure and member define a telescopic arrangement. This reduces the space required for retracting the member. In this case, conveniently the member comprises a tube mounted for telescopic movement along a support member of the support structure, part of the support member being adapted to engage and pivot the phosphor scintillator as the tube moves to the retracted position.

The detector could be positioned so as to directly view the phosphor scintillator. However, there is a risk that it will receive X-rays and thus preferably the device further comprises a mirror for reflecting light from the phosphor scintillator towards the detector. This enables the detector to be positioned offset from a direct line of sight with the phosphor scintillator so that any X-rays will pass through the mirror and be absorbed by the support structure.

The support structure could in some cases form part of the electron detection device housing, for example being an integral extension of that housing. Conveniently, however, the support structure defines a wall which is sealed in use about a port of the electron microscope chamber.

When analysing the diffraction pattern obtained from the sample, it is important to know the geometrical relationship of the phosphor scintillator to the source (i.e. the point where the incident focused electron beam strikes the sample). The "pattern centre" is usually determined by moving the phosphor scintillator in and out along the axis of retraction and taking two patterns at different distances. The part of the pattern which does not move is effectively the "pattern centre".

In accordance with a second aspect of the present invention, an electron detection device for use with an electron microscope defining a sample chamber comprises a support member from which depends a phosphor scintillator, the phosphor scintillator being movable on the support member between an active position in which the phosphor scintillator is close enough to a sample to be struck by electrons and a rest position; a control system for controlling movement of the phosphor scintillator; and a detector for monitoring light emitted by the phosphor scintillator in response to electron impact when the phosphor scintillator is in its active position, and for viewing the source when the phosphor scintillator is in its rest position.

This aspect of the invention makes use of the fact that the detector will have a sufficient depth of focus that the pattern centre can be determined even though the view with the scintillator in the rest position is slightly blurred. This assumes, of course, that the source sample is fluorescent. This provides a convenient and fast way of finding the pattern centre and calibrating the detector system without any retraction being required.

The phosphor scintillator could be mounted to the support member in a variety of ways to enable it to be moved between its two positions but particularly conveniently it is pivoted as described earlier. Nevertheless, it will be appreciated that it is not essential in this aspect of the invention for the phosphor scintillator to be mounted on a retractable support member.

BRIEF DESCRIPTION OF THE DRAWINGS

An example of a scanning electron microscope to which an electron detection device according to the invention has been mounted will now be described with reference to the accompanying drawings, in which.

DETAILED DESCRIPTION OF EMBODIMENT

Figure 1:
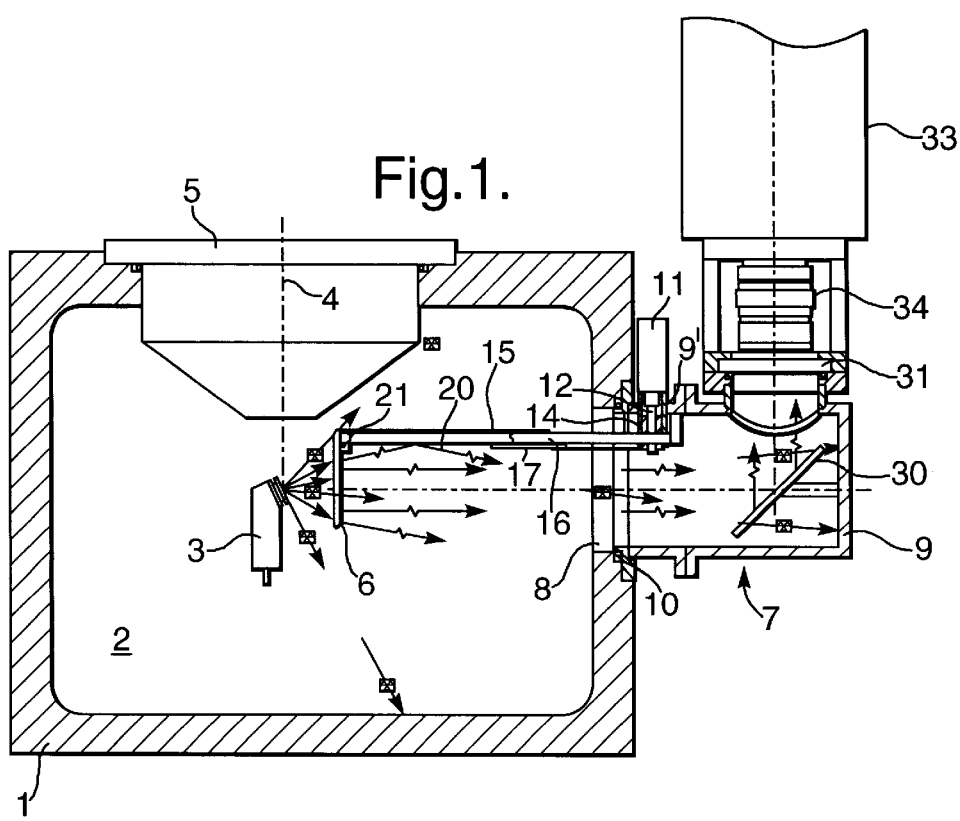
FIG. 1 is a schematic cross-section through part of the microscope and electron detection device with the phosphor scintillator in its extended position; and, FIG. 2 is a view similar to FIG. 1 but with the phosphor scintillator in its retracted position.

The system shown in the drawings comprises a scanning electron microscope (SEM) part of a housing or chamber 1 of which is shown in the drawings. The housing 1 defines a sample chamber 2 which is evacuated in use. A support 3 is located in the sample chamber on which a sample is provided in use and an electron beam 4 from a source (not shown) passes through a window 5 (a final objective lens) to impinge on the sample. As in conventional EBSD, secondary or backscattered electrons are emitted by the sample and will impact on a phosphor scintillator substrate 6 positioned close to the sample. The phosphor scintillator substrate 6 forms part of an electron detection device 7 mounted to a port 8 of the SEM housing 1. The electron detection device includes a tubular, metal housing 9 which is sealed by a static annular seal 10 to the port 8. An actuator motor 11 is mounted on the housing 9 and has a rotating shaft 12 which extends through an opening 9' in the housing 9 and is sealed by a motor shaft seal 13 and continues through a tubular bushing 14 secured to the metal housing 9.

It will be noted, therefore, that the only dynamic seal required is the motor shaft seal 13 which has a very small diameter and achieves sealing against atmospheric pressure in a very reliable and cost effective manner despite the need to rotate the shaft 12.

The phosphor scintillator substrate 6 is mounted on a support tube 15 which in turn is mounted for telescopic movement on a support shaft 16 along which the support tube 15 translates in a telescopic manner toward and away from the sample. This movement is caused by rotation of the shaft 12 under the control of the motor 11, the shaft 12 being coupled via a linkage 17, in this case a gear train and gear rack, to the support tube 15. Alternative mechanical linkage devices include a multi-bar linkage, cables, springs and pulleys, and a lead screw. The motor 11 is controlled by computer software to retract and extend the phosphor scintillator substrate 6 as necessary.

Figure 2:
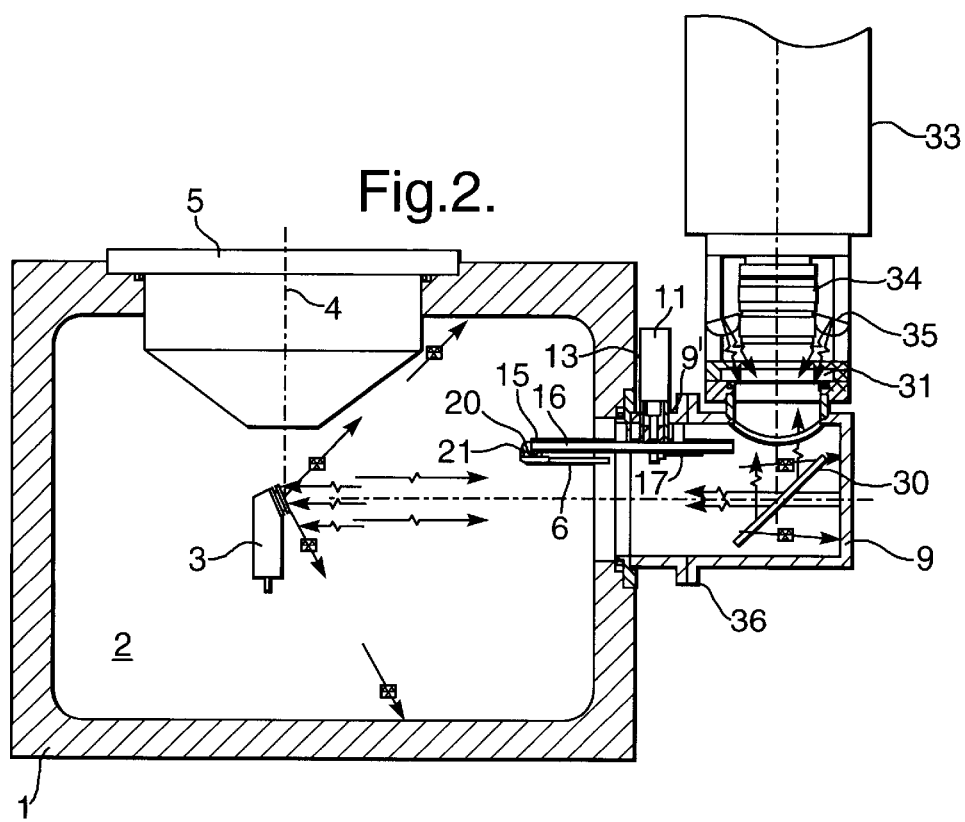

The phosphor scintillator substrate 6 is pivoted to the support tube 15 at 20 and carries a stop pin 21 at its inner end. As the support tube 15 is retracted, the phosphor scintillator substrate 6 will initially maintain its orientation shown in FIG. 1. However, when the stop pin 21 first touches the spherical end of the support shaft 16 the phosphor substrate begins to rotate about the pivot 20. Rotation of the phosphor substrate 6 continues as the support tube 15 is retracted further until the stop pin 21 is in contact with the bottom side of the support shaft as seen in FIG. 2.

Often, the SEM is used for a wide variety of purposes requiring the installation of many different analytical instruments. These instruments sometimes require the same space at the same time and cannot coexist at a single installation, limiting the choice of analysis that can be performed. The typical EBSD detector has extremely limited flexibility to avoid these situations of interfering conflicts. In the retracted position, however, the phosphor substrate 6 and the retraction mechanism are out of the way of other apparatus that may be used in the SEM. The fragile phosphor substrate 6 is thus protected from damage by other devices in motion within the SEM chamber.

In use, during EBSD pattern generation, light emitted from the phosphor substrate 6 is reflected at the surface of an elliptical mirror 30 located in the metal housing 9 and passes through an optical glass window 31. The optical glass window 31 has high light transmission properties and is not required to have any X-ray stopping power since X-rays generated within the sample chamber 2 will not be reflected by the mirror but simply pass through and be absorbed by the housing itself.

A camera 33 is mounted above the optical glass window 31 and carries a lens 34 in a conventional manner.

An additional benefit of being able to pivot the phosphor substrate 6 in the retracted position is that external light sources 35 (or internal light sources not shown) can be switched on to enter the metal housing 9, reflect at the mirror surface 30, and illuminate the sample for viewing by the camera 33. This is useful for positioning the sample when preparing to collect EBSD patterns.

A further benefit of the ability to pivot the phosphor substrate 6 to its rest position is in determining the pattern centre as described above. This is possible where the sample is fluorescent and the lens 34 has a sufficient depth of focus.

The metal housing 9, the mirror 30, lens 34 and camera 33 have the versatility to be rotated about an axis at the center of the mirror to avoid interfering conflicts with other apparatus fixed to exterior of the SEM chamber. This is accomplished by the insertion of an intermediate flange system 36 (shown as dashed lines) between the motor actuator 11 and the camera and lens mount.

Whereas in a conventional EBSD arrangement, the tube and camera project outwards from the electron microscope column, in this arrangement, the camera can be mounted vertically and intrude less into the room space around the electron column and avoid interfering with other devices.

We claim:

1. An electron detection device for use with an electron microscope defining a sample chamber, the device comprising:
   a housing which in use is mounted to and opens into or forms part of a sample chamber of an electron microscope;
   a support structure attached to the detection device housing and in communication with the sample chamber in use, the support structure supporting within it a member from which depends a phosphor scintillator, the member being movable between an extended position in which the phosphor scintillator is close enough to a sample to be struck by electrons and a retracted position;
   a control system that controls movement of the member; and
   a detector that monitors light emitted by the phosphor scintillator in response to electron impact.

2. A device according to claim 1, wherein the control system includes a rotatably mounted shaft extending through the bore of the support structure to which it is sealed by a dynamic annular seal.

3. A device according to claim 2, wherein the seal is an O-ring.

4. A device according to claim 1, wherein the phosphor scintillator is pivoted to the member so that it can be rotated into a rest position when not in use.

5. A device according to claim 4, wherein the phosphor scintillator is coupled to the member such that movement of the member causes pivoting movement of the phosphor scintillator.

6. A device according to claim 1, wherein the support structure and member define a telescopic arrangement.

7. A device according to claim 6, wherein the phosphor scintillator is coupled to the member such that movement of the member causes pivoting movement of the phosphor scintillator, and wherein the member comprises a tube mounted for telescopic movement along a support member of the support structure, part of the support member being adapted to engage and pivot the phosphor scintillator as the tube moves to the retracted position.

8. A device according to claim 1, further comprising a mirror that reflects light from the phosphor scintillator towards the detector.

9. An electron detection device for use with an electron microscope defining a sample chamber, the device comprising:
   a support member from which depends a phosphor scintillator, the phosphor scintillator being movable on the support member between an active position in which the phosphor scintillator is close enough to a sample to be struck by electrons and a rest position;
   a control system that controls movement of the phosphor scintillator; and
   a detector that monitors light emitted by the phosphor scintillator is in its active position, and that views the source when the phosphor scintillator is in its rest position.

10. A device according to claim 9, wherein the control system includes a rotatably mounted shaft extending through a bore of the support structure to which it is sealed by a dynamic annular seal.

11. A device according to claim 10, wherein the seal is an O-ring.

12. A device according to claim 9, wherein the phosphor scintillator is pivoted to the member so that it can be rotated into a rest position when not in use.

13. A device according to claim 12, wherein the phosphor scintillator is coupled to the member such that movement of the member causes pivoting movement of the phosphor scintillator.

14. A device according to claim 9, further comprising a mirror that reflects light from the phosphor scintillator towards the detector.

15. An electron microscope defining a sample chamber to which is mounted an electron detection device according to claim 1.

16. An electron microscope defining a sample chamber to which is mounted an electron detection device according to claim 9.

* * * * *